United States Patent
Yoo et al.

(10) Patent No.: US 9,321,958 B2
(45) Date of Patent: Apr. 26, 2016

(54) YELLOW LIGHT EMITTING PHOSPHOR AND LIGHT EMITTING DEVICE PACKAGE USING THE SAME

(71) Applicant: LG ELECTRONICS INC., Seoul (KR)

(72) Inventors: Younggil Yoo, Seoul (KR); Minsung Kim, Seoul (KR); Jeongsoo Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/737,175

(22) Filed: Jun. 11, 2015

(65) Prior Publication Data

US 2016/0009990 A1   Jan. 14, 2016

(30) Foreign Application Priority Data

Jul. 14, 2014   (KR) .................. 10-2014-0088306

(51) Int. Cl.
*C09K 11/77* (2006.01)
*H01L 33/50* (2010.01)
*C09K 11/64* (2006.01)

(52) U.S. Cl.
CPC ........... *C09K 11/7774* (2013.01); *C09K 11/646* (2013.01); *C09K 11/7734* (2013.01); *H01L 33/504* (2013.01)

(58) Field of Classification Search
None
See application file for complete search history.

(56) References Cited

U.S. PATENT DOCUMENTS

| 7,824,573 | B2 * | 11/2010 | Watanabe et al. ....... 252/301.4 F |
| 8,569,083 | B2 * | 10/2013 | Lu et al. ..................... 438/28 |
| 8,801,970 | B2 * | 8/2014 | Watanabe et al. ....... 252/301.4 F |
| 2008/0203901 | A1 * | 8/2008 | Bukesov et al. ............. 313/503 |
| 2009/0014741 | A1 | 1/2009 | Masuda et al. |
| 2009/0146549 | A1 | 6/2009 | Kimura et al. |
| 2010/0283381 | A1 | 11/2010 | Takahashi et al. |
| 2013/0214675 | A1 * | 8/2013 | Watanabe et al. ............. 313/503 |
| 2013/0257264 | A1 * | 10/2013 | Tamaki et al. ................ 313/503 |
| 2014/0091346 | A1 | 4/2014 | Fuji et al. |
| 2015/0159836 | A1 * | 6/2015 | Tamaki et al. ................ 313/503 |

FOREIGN PATENT DOCUMENTS

| JP | 2007-204730 A | 8/2007 |
| JP | 2011-213839 A | 10/2011 |
| KR | 10-2009-0048589 A | 5/2009 |
| KR | 10-2012-0014853 A | 2/2012 |

(Continued)

OTHER PUBLICATIONS

Korean Office Action dated Aug. 14, 2014 issued in Application No. 10-2014-0088306 (with English translation).
Korean Office Decision to Grant a Patent dated Nov. 19, 2014 issued in Application No. 10-2014-0088306 (with English translation).
Hirosaki et al., "New Sialon Phosphor and Development of White LED Using the Same," as referenced in Japanese Application No. 2015-119246 dated Jul. 14, 2015 (Original Japanese Article and English Translation).

(Continued)

*Primary Examiner* — Scott B Geyer
(74) *Attorney, Agent, or Firm* — Ked & Associates, LLP

(57) ABSTRACT

Disclosed are phosphors and, more particularly, yellow light emitting phosphors and light emitting device packages using the same. The yellow light emitting phosphor includes a first phosphor to emit light having a central wavelength located within a band of 510 nm to 550 nm, a second phosphor adapted to be mixed with the first phosphor to emit light having a central wavelength located within a band of 560 nm to 600 nm, and a third phosphor adapted to be mixed with the first and second phosphors to emit light having a central wavelength located within a band of 610 nm to 630 nm, the third phosphor having a light absorption rate of 50% or less at a wavelength of 550 nm.

20 Claims, 5 Drawing Sheets

(56) References Cited

FOREIGN PATENT DOCUMENTS

| KR | 10-2013-0047022 A | 5/2013 |
| KR | 10-1297619 B1 | 8/2013 |
| TW | 201412928 A | 4/2014 |
| WO | WO 2010/018873 A1 | 2/2010 |
| WO | WO 2014/077132 A1 | 5/2014 |

OTHER PUBLICATIONS

European Search Report dated Oct. 23, 2015 issued in Application No. 15001711.9.

Taiwanese Office Action dated Feb. 22, 2016 issued in Application No. 104117506 (with English translation).

* cited by examiner

YELLOW LIGHT EMITTING PHOSPHOR AND LIGHT EMITTING DEVICE PACKAGE USING THE SAME

This application claims the benefit of Korean Patent Application No. 10-2014-0088306, filed on Jul. 14, 2014, which is hereby incorporated by reference as if fully set forth herein.

BACKGROUND OF THE INVENTION

1. Field of the Invention

The present invention relates to phosphors and, more particularly, to yellow light emitting phosphors and light emitting device packages using the same.

2. Discussion of the Related Art

Light emitting diodes (LEDs) are next-generation light emitting devices capable of substituting for fluorescent lamps, which are the most commonly used existing normal luminaires.

LEDs have less power consumption than existing light sources and may be regarded as being eco-friendly because they do not include mercury unlike fluorescent lamps. In addition, LEDs have advantages including long lifespan and high response speed as compared to existing light sources.

These LEDs may be used in conjunction with phosphors that absorb light emitted from LEDs to emit various colors of light. These phosphors may usually emit yellow light, green light, and red light.

White LEDs are currently fabricated into a combination of LEDs that emit blue light and phosphors adapted to convert emission wavelengths. Expansion in the use range of white LEDs causes requirement of more efficient LEDs and, to this end, emission efficiency of phosphors needs to be improved. In addition, demand for LEDs having greater reliability is increasing.

While yttrium aluminum garnet (YAG) phosphors, which are oxide phosphors as disclosed in U.S. Pat. No. 5,998,925, are known as yellow phosphors used in LEDs, the YAG phosphors have low thermal stability, which may problematically cause luminance deterioration and color coordinate variation at a high temperature.

In addition, while oxide phosphors and silicate-based phosphors are known as yellow and green phosphors, these phosphors have relatively low thermal stability and poor water resistance, thus being likely to have a negative effect on reliability of LED packages.

Therefore, there is a need to develop highly efficient and reliable phosphors capable of creating white light in cooperation with LEDs.

Moreover, blue LEDs may exhibit a wavelength shift to a shorter wavelength as output of the blue LEDs becomes higher and, therefore, there is a need to develop yellow light emitting phosphors that exhibit high excitation efficiency even at short wavelengths.

In addition, there is a need to develop phosphors having an excellent color rendering characteristic when the phosphors are used along with LEDs to produce white light.

SUMMARY OF THE INVENTION

Accordingly, the present invention is directed to yellow light emitting phosphors and light emitting device packages using the same that substantially obviate one or more problems due to limitations and disadvantages of the related art.

One object of the present invention is to provide yellow light emitting phosphors having high emission efficiency, high luminance, and an excellent color rendering characteristic, and light emitting device packages using the same.

Additional advantages, objects, and features will be set forth in part in the description which follows and in part will become apparent to those having ordinary skill in the art upon examination of the following or may be learned from practice. The objectives and other advantages may be realized and attained by the structure particularly pointed out in the written description and claims hereof as well as the appended drawings.

To achieve these objects and other advantages and in accordance with the purpose of the invention, as embodied and broadly described herein, in accordance with a first aspect of the present invention, a yellow light emitting phosphor includes a first phosphor adapted to emit light having a central wavelength located within a band of 510 nm to 550 nm, a second phosphor adapted to be mixed with the first phosphor to emit light having a central wavelength located within a band of 560 nm to 600 nm, and a third phosphor adapted to be mixed with the first and second phosphors to emit light having a central wavelength located within a band of 610 nm to 630 nm, the third phosphor having a light absorption rate of 50% or less at a wavelength of 550 nm.

Here, the second phosphor may include at least one of α-type SiAlON(Li-α-SiAlON:Eu) containing Li as a metal component and α-type SiAlON(Ca-α-SiAlON:Eu) containing Ca as a metal component.

Here, the second phosphor may be represented by the following chemical formula 1:

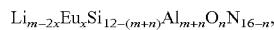

$Li_{m-2x}Eu_xSi_{12-(m+n)}Al_{m+n}O_nN_{16-n}$, where, "m" and "n" fulfill at least one condition of $0 \leq m \leq 2$ and $0 \leq n \leq 1$.

Here, the first phosphor may include at least one of $BaYSi_4N_7$:Eu, $Ba_3Si_6O_{12}N_2$:Eu, $CaSi_2O_2N_2$:Eu, $SrYSi_4N_7$:Eu, α-type SiAlON(Ca-α-SiAlON:Yb) containing Ca as a metal component, LuAG, $SrSi_2O_2N_2$:Eu, and β-type SiAlON:Eu.

Here, the first phosphor may be present in an amount of 62 wt % to 75.8 wt % when the sum of the first phosphor to the third phosphor is 100 wt %.

Here, the second phosphor may be present in an amount of 20 wt % to 35 wt % when the sum of the first phosphor to the third phosphor is 100 wt %.

Here, the third phosphor may be present in an amount of 3 wt % to 4.2 wt % when the sum of the first phosphor to the third phosphor is 100 wt %.

Here, a ratio of the third phosphor to the second phosphor may be within a range of 8.6% to 21.0%.

Here, the third phosphor may include at least one of $CaAlSiN_3$:Eu, $(Sr, Ca)AlSiN_3$:Eu, $Sr_2Si_5N_8$:Eu, $K_2SiF_6$:Mn, $La_3Si_6N_{11}$:Ce, $SrAlSiN_3$:Eu, $SrCN_2$:Eu, $Ca_2Si_5N_8$:Eu, $Ba_2Si_5N_8$:Eu, $SrAlSi_4N_7$:Eu, and $(Sr, Ba)SiN_2$:Eu.

Here, an emission spectrum of the yellow light emitting phosphor within a wavelength band of 480 nm to 780 nm may have a full width at half maximum of 120 nm or more.

In accordance with a second aspect to achieve the technical object as described above, a yellow light emitting phosphor includes a first phosphor adapted to emit light having a central wavelength located within a band of 510 nm to 550 nm, a second phosphor adapted to emit light having a central wavelength located within a band of 560 nm to 600 nm, and a third phosphor adapted to emit light having a central wavelength located within a band of 610 nm to 630 nm, wherein a mixture of the first phosphor to the third phosphor is excited by near ultraviolet (UV) or blue excitation light to emit light of a spectrum having a central wavelength located within a band of 480 nm to 780 nm, and a full width at half maximum of the spectrum is 120 nm or more.

Here, the third phosphor may be designed to minimize absorption of light caused by the excitation light.

Here, the third phosphor may have a light absorption rate of 50% or less at a wavelength of 550 nm.

In accordance with a third aspect to achieve the technical object as described above, a yellow light emitting phosphor includes a first phosphor adapted to emit light having a central wavelength located within a band of 510 nm to 550 nm, a second phosphor adapted to emit light having a central wavelength located within a band of 560 nm to 600 nm, and a third phosphor adapted to emit light having a central wavelength located within a band of 610 nm to 630 nm, wherein weight proportions of the first phosphor, the second phosphor, and the third phosphor are respectively within a range of 62 wt % to 75.8 wt %, within a range of 20 wt % to 35 wt %, and within a range of 3 wt % to 4.2 wt % when the sum of the first phosphor to the third phosphor is 100 wt %.

In accordance with a fourth aspect to achieve the technical object as described above, a light emitting device package includes the yellow light emitting phosphor, and a light emitting device configured to emit near ultraviolet (UV) or blue light to excite the yellow light emitting phosphor.

It is to be understood that both the foregoing general description and the following detailed description of the present invention are exemplary and explanatory and are intended to provide further explanation of the present invention as claimed.

BRIEF DESCRIPTION OF THE DRAWINGS

The accompanying drawings, which are included to provide a further understanding of the present invention and are incorporated in and constitute a part of this application, illustrate embodiment(s) of the present invention and together with the description serve to explain the principle of the present invention. In the drawings.

DETAILED DESCRIPTION OF THE INVENTION

Figure 1:
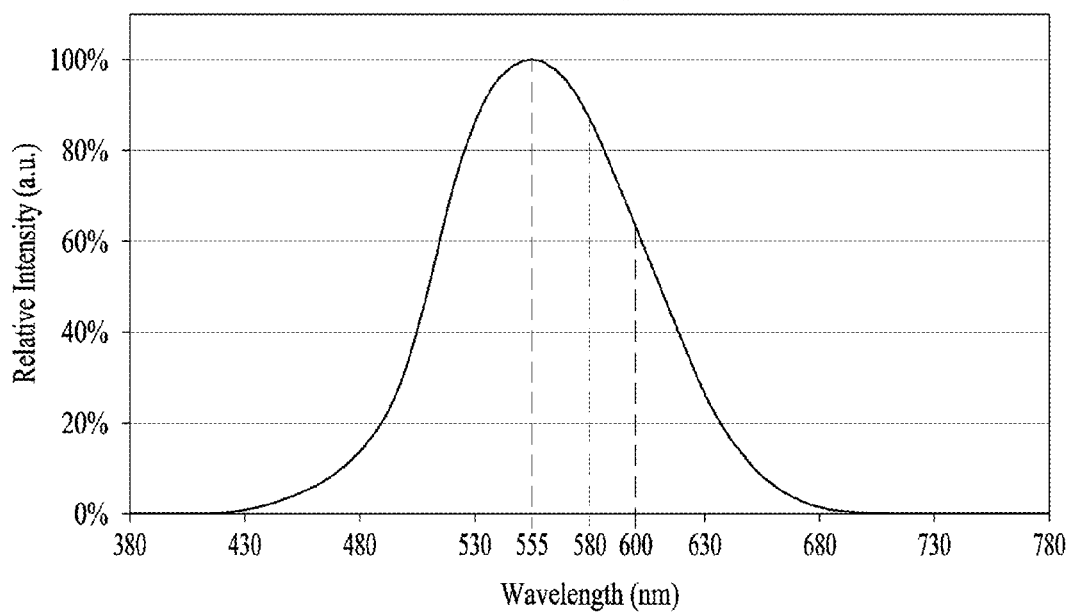
FIG. 1 is a graph showing a photopic curve that represents human visibility.

Hereinafter, exemplary embodiments of the present invention will be described in detail with reference to the accompanying drawings.

While the present invention is susceptible to various modifications and alternative forms, specific embodiments thereof are shown by way of example in the drawings and will herein be described in detail. It should be understood, however, that there is no intent to limit the present invention to the particular forms disclosed, but on the contrary, the present specification is to cover all modifications, equivalents, and alternatives falling within the spirit and scope of the specification as defined by the claims.

It will be understood that, when an element such as a layer, region or substrate is referred to as being "on" another element, it can be directly on the other element or intervening elements may also be present.

It will be understood that, although the terms first, second, etc. may be used herein to describe various elements, components, regions, layers and/or sections, these elements, components, regions, layers and/or sections should not be limited by these terms.

According to the present invention, yellow light having high luminance and an excellent color rendering characteristic may be produced by mixing green, amber, and red phosphors which are excited with high efficiency by near ultraviolet (UV) and blue light as an excitation source.

A phosphor that emits yellow light as described above may be a mixture of a first phosphor (green phosphor) that emits light having a central wavelength located within a band of 510 to 550 nm, a second phosphor (amber phosphor) that emits light having a central wavelength located within a band of 560 to 600 nm, and a third phosphor (red phosphor) that emits light having a central wavelength located within a band of 610 to 630 nm.

In the following description, the first phosphor will be referred to as a green phosphor, the second phosphor will be referred to as an amber phosphor, and the third phosphor will be referred to as a red phosphor.

The green phosphor, the amber phosphor, and the red phosphor may include materials as follows.

More specifically, the green phosphor may include at least one of $BaYSi_4N_7$:Eu, $Ba_3Si_6O_{12}N_2$:Eu, $CaSi_2O_2N_2$:Eu, $SrYSi_4N_7$:Eu, α-type SiAlON(Ca-α-SiAlON:Yb) containing Ca as a metal component, LuAG, $SrSi_2O_2N_2$:Eu, and β-type SiAlON:Eu.

The green phosphor may emit light having a central wavelength located within a band of 510 to 550 nm as mentioned above.

Here, LuAG is known as a chemical formula of $Lu_3Al_5O_{12}$:Ce and β-type SiAlON:Eu may be represented by a chemical formula in which Eu is added to a basic structural formula of $Si_{6-z}Al_zO_zN_{8-z}$.

The amber phosphor may include at least one of α-type SiAlON(Li-α-SiAlON:Eu) containing Li as a metal component and α-type SiAlON(Ca-α-SiAlON:Eu) containing Ca as a metal component.

The amber phosphor may emit light having a central wavelength located within a band of 560 to 600 nm as mentioned above.

The red phosphor may include at least one of $CaAlSiN_3$:Eu, (Sr,Ca)$AlSiN_3$:Eu(SCASN), $Sr_2Si_5N_8$:Eu, $K_2SiF_6$:Mn, $La_3Si_6N_{11}$:Ce, $SrAlSiN_3$:Eu, $SrCN_2$:Eu, $Ca_2Si_5N_8$:Eu, $Ba_2Si_5N_8$:Eu, $SrAlSi_4N_7$:Eu, and (Sr,Ba)$SiN_2$:Eu.

The red phosphor may emit light having a central wavelength located within a band of 610 to 630 nm as mentioned above.

While nitride phosphors or oxide nitride phosphors are primarily described as examples of the green phosphor, the amber phosphor, and the red phosphor, of course, it will be understood that other phosphors except for these phosphors may be used.

Here, the amber phosphor may be represented by the following chemical formula, and "m" and "n" may fulfill at least one condition of 0≤m≤2 and 0≤n≤1.

$Li_{m-2x}Eu_xSi_{12-(m+n)}Al_{m+n}O_nN_{16-n}$     Chemical Formula 1

Meanwhile, the red phosphor may exhibit a light absorption rate of 50% or less at a wavelength of 550 nm. That is, 50% or less of the red phosphor may be excited by light having a wavelength of 550 nm. This will be described later in detail.

With the yellow light emitting phosphor obtained by mixing the green phosphor, the amber phosphor, and the red phosphor having features as described above, a full width at half maximum of an emission spectrum within a wavelength band of 480 to 780 nm may be 120 nm or more. This may mean that the yellow light emitting phosphor achieves a considerably increased color rendering characteristic.

Here, the green phosphor may be present in an amount of 62 to 75.8 wt % when the sum of the green phosphor, the amber phosphor, and the red phosphor is 100 wt %.

The amber phosphor may be present in an amount of 20 to 35 wt % when the sum of the green phosphor, the amber phosphor, and the red phosphor is 100 wt %.

The red phosphor may be present in an amount of 3 to 4.2 wt % when the sum of the green phosphor, the amber phosphor, and the red phosphor is 100 wt %.

Meanwhile, a proportion of the red phosphor with respect to the amber phosphor may be within a range of 8.6% to 21.0%.

The mixture of the green phosphor, the amber phosphor, and the red phosphor as described above may be excited by near UV or blue light to emit yellow light having high luminance. In addition, the yellow light may be combined with blue light as an excitation source to enable emission of white light having high luminance and an excellent color rendering characteristic. Accordingly, the resulting phosphor may achieve high emission efficiency owing to a high excitation rate thereof by near UV or blue light.

While α-type SiAlON containing Ca as a metal component has an emission central wavelength of about 600 nm, as described above, using Li-α-SiAlON having a central wavelength located within a band of 550 to 590 nm may increase visibility by about 25% with respect to emission of light having the same peak strength. More preferably, greater visibility may be achieved by enabling emission of light having a central wavelength located within a band of 578 to 588 nm. In addition, higher luminance and a more excellent color rendering characteristic may be achieved by mixing a red phosphor, a light absorption rate of which within a band of 550 to 560 nm is adjusted. However, as mentioned above, in some cases, even a phosphor that emits light having a central wavelength located within a band of 560 to 600 nm may achieve characteristics of the present invention.

FIG. 1 is a graph showing a photopic curve that represents human visibility.

As shown, a value of human visibility becomes the maximum at a wavelength of about 555 nm. That is, humans sense that light having a wavelength of 555 nm is the strongest light with respect to the same luminous intensity.

Accordingly, Li-α-SiAlON having a central wavelength located within a band of 550 to 590 nm, used in the present invention, may achieve greater visibility than α-type SiAlON that typically having an emission central wavelength of about 600 nm.

That is, a viewer can sense light having the same luminous intensity as if the light is brighter and, therefore, this emission wavelength adjustment may cause luminance increase effects.

Li-α-SiAlON, which may be used as the amber phosphor according to the present invention, may improve visibility by about 25% as compared to Ca-α-SiAlON with respect to emission of light having the same peak strength.

In the present invention, to achieve emission of light having a central wavelength located within a band of 550 to 590 nm, the substitution amount of Li as well as the amount of oxygen may be adjusted upon synthesis of SiAlON.

Table 1 shows emission wavelengths (peak wavelengths) and emission luminance of the amber phosphor acquired by adjusting the amount of oxygen (n; the value in the above chemical formula 1).

For this emission, in the above chemical formula 1, "m" and "n" may fulfill at least one condition of 0≤m≤2 and 0≤n≤1. In addition, in the above chemical formula 1, "x" designates the amount of an activator (Eu) and is normally substituted with metal ions (lithium (Li) and aluminum (Al)) within a range of 10% or less. That is, "x" may have a value within a range of 0.01 to 0.1.

TABLE 1

| Amount of Oxygen (n) | Emission wavelength (nm) | Emission brightness |
|---|---|---|
| 0 | 588 | 95% |
| 0.1 | 583 | 100% |
| 0.25 | 581 | 92% |
| 0.5 | 581 | 91% |
| 1 | 578 | 85% |
| 2 | 560 | 60% |

As can be seen from Table 1, an emission wavelength may vary according to the amount of oxygen in the amber phosphor. That is, it can be appreciated that the emission wavelength is 588 nm and the emission luminance is 95% when the amount of oxygen (n) is 0 and that the emission wavelength may be reduced to 578 nm when the amount of oxygen (n) is 1.

In addition, in the case of varying the amount of oxygen (n) to a range of 1≤n≤2 to improve emission efficiency via an additional visibility characteristic, it is possible to vary the emission wavelength to 560 nm. In this way, through adjustment in the amount of oxygen and, more particularly, through increase in the amount of oxygen, an emission wavelength of the phosphor may be easily shifted to a shorter wavelength.

As can be seen from Table 1, the highest emission luminance is achieved when the amount of oxygen (n) is 0.1 and the emission wavelength is 583 nm.

As described above, the present invention may produce yellow light exhibiting excellent luminance by mixing the first phosphor as a green light emitting phosphor and the second phosphor as an amber light emitting phosphor.

In addition, improved emission luminance may be achieved by adjusting emission wavelengths of the green phosphor and the amber phosphor and a mixing ratio thereof. Simultaneously, a color rendering index (CRI) that indicates a color rendering characteristic of a light source may be improved.

The color rendering index (CRI) is an index for indication of a color rendering characteristic of a light source and has a numerical value that indicates a coincidence degree between color perception of an object under a sample light source and color perception of the same object under a prescribed reference light source.

Table 2 shows that luminance and CRI may be improved by mixing the green phosphor and the amber phosphor as follows.

TABLE 2

| Phosphor | | Color Coordinates | | CRI | Emission Luminance |
|---|---|---|---|---|---|
| | | CIEx | CIEy | | |
| Yellow Phosphor | | 0.454 | 0.531 | 36.5 | 100 |
| 535 nm Green (%) | 600 nm Amber (%) | 0.458 | 0.513 | 48.5 | 89 |
| 535 nm Green (%) | 583 nm Amber (%) | 0.444 | 0.527 | 39.7 | 103.8 |

That is, it can be appreciated that the yellow light emitting phosphor using the green phosphor (having a peak wavelength of 535 nm) and the amber phosphor (having a peak wavelength of 583 nm) according to the present invention may achieve higher emission luminance and CRI as compared to a conventional yellow light emitting phosphor using a yellow phosphor (that refers to a typical widely used YGA phosphor) and Ca-α-SiAlON.

Figure 2:
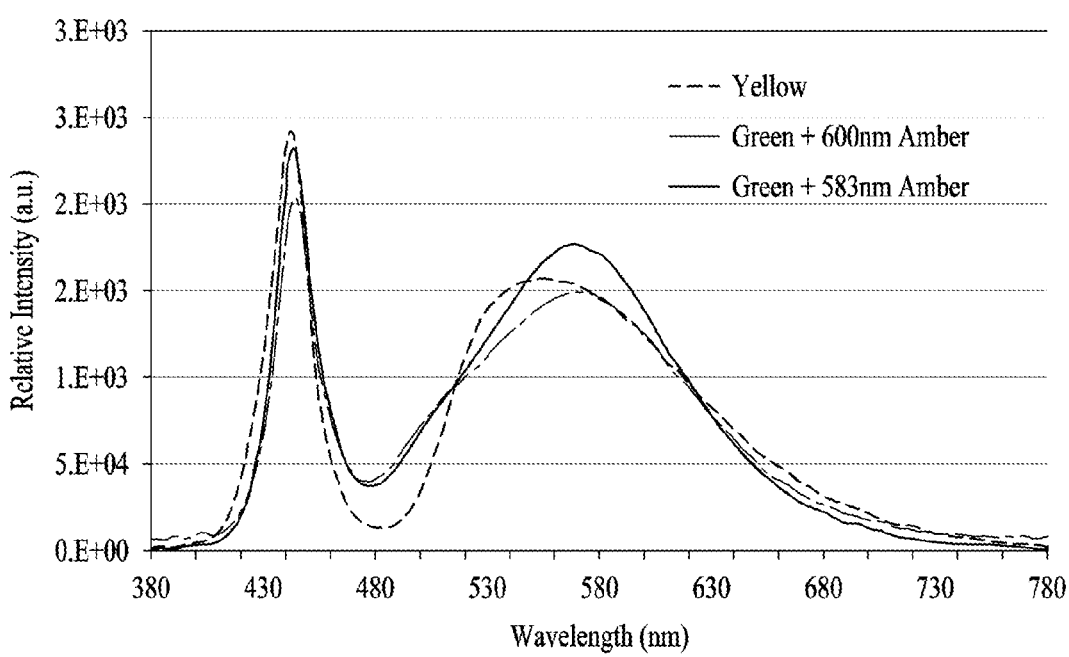
FIG. 2 is a graph showing an emission spectrum in an example of a white light emitting device package using a yellow light emitting phosphor.

FIG. 2 is a graph showing an emission spectrum in one example of a white light emitting device package using a yellow light emitting phosphor.

As exemplarily shown in FIG. 2, it can be appreciated that high quality white light may be emitted via combination of blue excitation light and yellow light emitted as a yellow light emitting phosphor is excited by the blue light.

That is, the example of the yellow light emitting phosphor (a mixture of a green phosphor and a 583 nm amber phosphor) exhibits a superior optical characteristic to a conventional yellow light emitting phosphor and another example (a mixture of a green phosphor and a 600 nm amber phosphor).

In this way, owing to high luminous intensity and excellent visibility within a yellow light emitting band, the yellow light emitting phosphor may produce high quality white light in cooperation with near UV or a blue light emitting device.

A light emitting device package, which enables emission of yellow light using a combination of a green phosphor and an amber phosphor as described above, advantageously achieves a strong peak strength at or around a wavelength of 555 nm that ensures high visual efficiency.

However, considering a spectrum of the light emitting device package as exemplarily shown in FIG. 2, a full width at half maximum of a wavelength within a band of 500 to 600 nm may not be sufficiently wide for application to high quality luminaires.

Accordingly, to allow luminaires to achieve high-grade color expression, a uniform peak strength in a visible light wavelength range (i.e. in a band of 380 to 780 nm) needs to be achieved. This may improve a color rendering characteristic, which is represented by a color rendering index (CRI) of light, to become close to that of sunlight.

In addition, through provision of the light emitting device package having a wide spectrum as described above, a display using the same may show color of a wide gamut.

As mentioned above, the color rendering index (CRI) is an index for indication of a color rendering characteristic of a light source and has a numerical value that indicates a coincidence degree between color perception of an object under a sample light source and color perception of the same object under a prescribed reference light source.

The color rendering index of a luminaire is a numerical value that indicates how similar a visual environment for color perception is to an environment under sunlight. More specifically, a degree of coincidence between a surface color of an object under a test light source and a surface color of the same object under a reference light source is quantified into a numerical value to measure quality of a luminaire.

To improve a color rendering characteristic beyond that as in the above-described case of attaining the yellow phosphor by mixing the green phosphor and the amber phosphor, an emission spectrum may be changed into a wider form to allow uniform peak strength distribution in a visible light wavelength range (in a band of 380 to 780 nm).

To achieve an improved spectrum form as described above, a long-wavelength red phosphor may be added to the green phosphor and the amber phosphor to make a phosphor mixture. In this way, a spectrum may be increased at a long wavelength of 580 nm or more and uniform peak strength may be achieved.

In addition, the amount of the green phosphor may be increased in order to achieve color balance with regard to mixing of the red phosphor as described above. That is, mixing of the red phosphor as described above may increase a spectrum at a longer wavelength on the basis of 550 nm, i.e. at a wavelength of 550 nm or more and, therefore, the amount of the green phosphor having a short wavelength (of 550 nm or less) may be increased for color balance.

Figure 3:
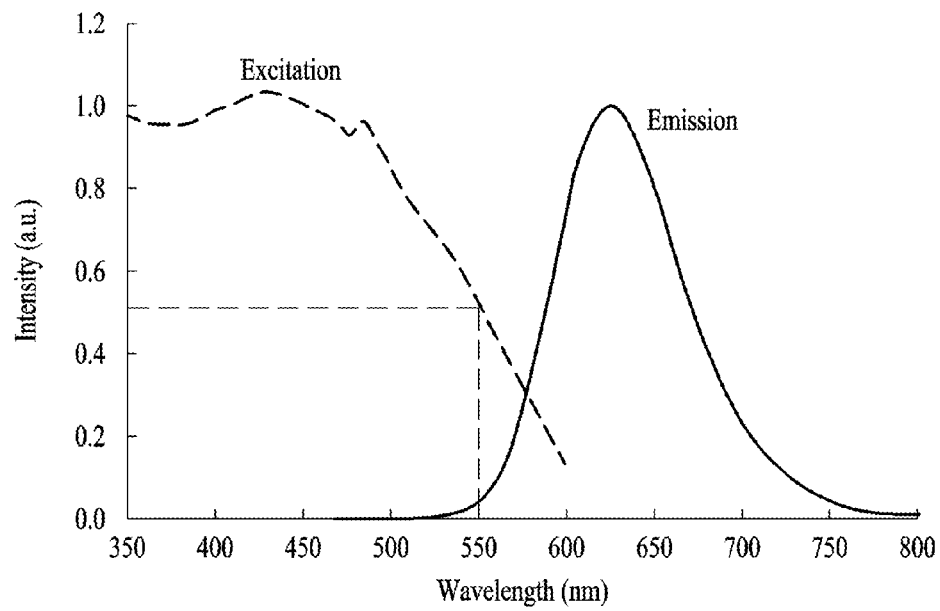
FIGS. 3 to 5 are graphs showing an excitation spectrum and an emission spectrum of a red phosphor.

Meanwhile, as exemplarily shown in FIG. 3, the red phosphor may perform light emission via absorption of (excitation by) blue light, light emitted from the green phosphor and the amber phosphor, and yellow light as a combination thereof.

In FIG. 3, the left dotted line designates an excitation spectrum, i.e. a spectrum of light absorbed by the red phosphor, and the right solid line designates an emission spectrum.

Accordingly, it is possible to minimize absorption of light except for blue excitation light by the red phosphor by adjusting an excitation spectrum of the red phosphor. This may prevent reduction in the emission efficiency of the yellow phosphor and, consequently, may increase the emission efficiency while improving a color rendering characteristic.

To this end, an absorption intensity of the red phosphor at a wavelength of 550 nm may be adjusted to 50% or less. That is, it is possible to minimize absorption of light emitted from the green, amber, and yellow phosphors by adjusting a point of a spectrum, where the absorption intensity of the red phosphor becomes 50%, to be located at a wavelength of 550 nm or less.

Design of the red phosphor as described above will now be below in detail.

Figure 4:
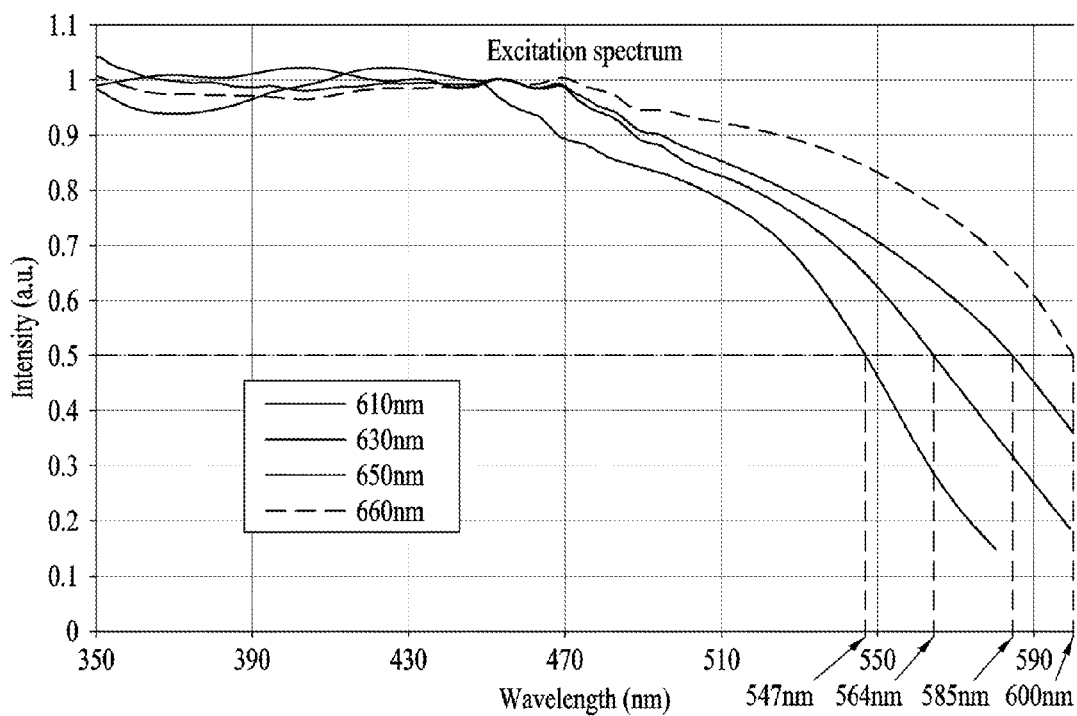

As mentioned above, in the case of mixing the red phosphor in order to achieve an improved emission characteristic, such as an improved color rendering characteristic, as exemplarily shown in FIG. 4, deterioration in luminance may occur because the red phosphor absorbs light within an emission wavelength band (e.g., green light having a wavelength of 530 nm and yellow light having a wavelength of 560 nm) emitted from the phosphors, in addition to excitation light.

To minimize this phenomenon, the red phosphor may be designed to minimize absorption of light except for excitation light by moving an excitation spectrum of the red phosphor to a shorter wavelength such that a light absorption rate of the red phosphor becomes 50% at a wavelength band of 550 nm or less.

Figure 5:
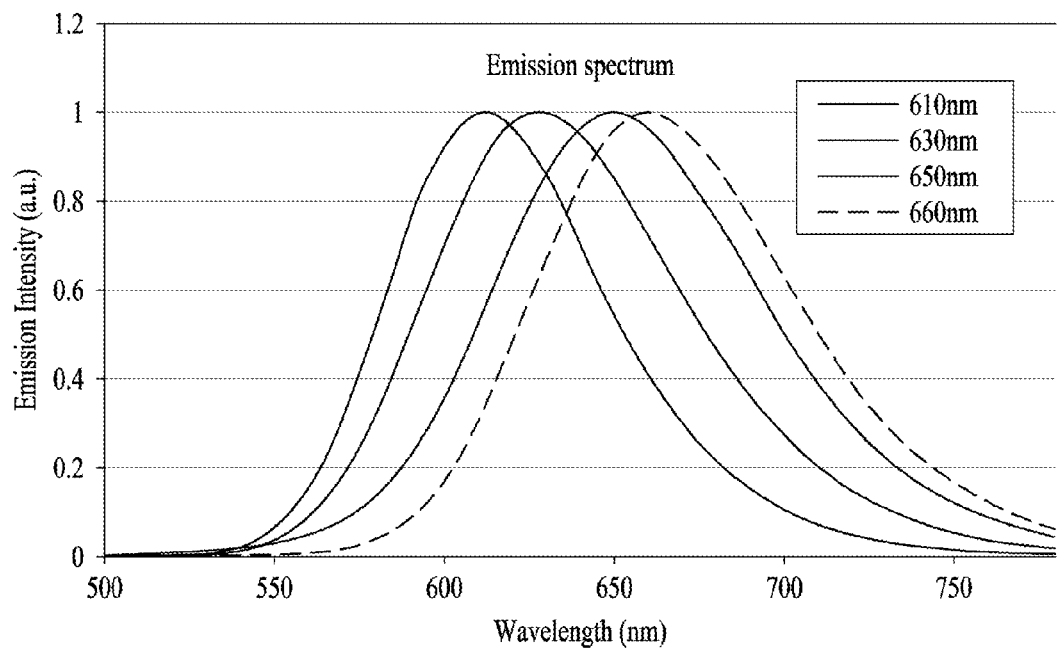

FIG. 4 shows an example of excitation (absorption) spectra depending on respective red light emitting wavelengths. In addition, FIG. 5 shows an example of emission spectra of red phosphors having different peak wavelengths.

In these examples, it can be appreciated that the red phosphor having a peak wavelength of 610 nm has a light absorption rate of 50% or less at a wavelength of 550 nm. More accurately, it can be appreciated that a light absorption rate of the red phosphor becomes 50% at a wavelength of 547 nm. In addition, it can be appreciated that a light absorption rate of the red phosphor having a peak wavelength of 630 nm becomes 50% at a wavelength of 564 nm, a light absorption rate of the red phosphor having a peak wavelength of 650 nm becomes 50% at a wavelength of 585 nm, and a light absorption rate of the red phosphor having a peak wavelength of 660 nm becomes 50% at a wavelength of 600 nm.

Through this design, it can be appreciated that using the red phosphor that has a peak wavelength of 610 nm and also has a light absorption rate of 50% or less at a wavelength of 550 nm may minimize absorption of light, rather than absorption of excitation light. However, in some cases, the red phosphors having peak wavelengths of 630 nm, 650 nm, and 660 nm in the above example may be used.

As described above, a light absorption rate of the red phosphor may be adjusted and, in turn, a color rendering characteristic as well as emission efficiency may be improved via selection of the red phosphor based on a peak wavelength of the red phosphor having the adjusted light absorption rate.

Example

Table 3 shows CRI and relative luminous flux depending on the proportions of phosphors.

As can be seen from Condition No. 3 of Table 3, in the case of using the aforementioned materials, an optimum CRI and emission efficiency (relative luminous flux) are acquired when a ratio of the red phosphor to the amber phosphor is 12.7%. Here, the emission efficiency is a relative value under assumption that a value in Condition No. 3 is 100%.

In addition, weight proportions of the green phosphor, the amber phosphor, and the red phosphor in the above case are respectively 67.7 wt %, 28.66 wt %, and 3.64 wt %. At this time, by rounding off the weight proportions to the nearest hundredths, the resulting values are respectively 67.7 wt %, 28.7 wt %, and 3.6 wt %. The CRI and the relative luminous flux based on these values may be sufficiently meaningful. For example, the rounded values may be within a tolerance range of optimum weight proportions in terms of the CRI and the relative luminous flux.

However, in other cases, meaningful CRI and emission efficiency with regard to phosphors may be acquired. That is, as shown in Table 3, the case in which weight proportion of the green phosphor is within a range of 62 to 75.8 wt %, the case in which the weight proportion of the amber phosphor is within a range of 20 to 35 wt %, and the case in which the weight proportion of the red phosphor is within a range of 3 to 4.2 wt % may be meaningful.

In addition, in the case in which the ratio of the red phosphor to the amber phosphor is within a range of 8.6% to

TABLE 3

| | Phosphor Proportion (%) | | | | | |
|---|---|---|---|---|---|---|
| Condition | Green Phosphor | Amber phosphor (580 nm) | Red phosphor (610 nm) | Ratio of Red phosphor to Amber phosphor | CRI | Relative luminous flux (%) |
| 1 | 62% | 35% | 3% | 8.6% | 64 | 96% |
| 2 | 66.58% | 30% | 3.42% | 11.4% | 68 | 98.4% |
| 3 | 67.7% | 28.66% | 3.64% | 12.7% | 74 | 100% |
| 4 | 71.2% | 25% | 3.8% | 15.2% | 77 | 98% |
| 5 | 75.8% | 20% | 4.2% | 21.0% | 82 | 94% |

In Table 3, a yellow phosphor is prepared by mixing a green phosphor, an amber phosphor having a peak wavelength of 580 nm, and a red phosphor having a peak wavelength of 610 nm with one another, and a CRI and relative luminous flux depending on the proportions of the respective phosphors are shown.

In the shown example, LuAG is used as the green phosphor, Li-α-SiAlON is used as the amber phosphor, and SCASN ((Sr, Ca)AlSiN$_3$:Eu) having an adjusted excitation wavelength is used as the red phosphor.

21.0%, the CRI or emission efficiency may be contemplated as a meaningful value that may be relatively increased when these phosphors are applied to a light emitting device package.

Table 4 shows comparison results of CRI and relative luminous flux between the case in which phosphors are mixed in proportions to achieve optimum CRI and emission efficiency (relative luminous flux) in Table 3 and other proportions of phosphors.

TABLE 4

| | Phosphor Proportion (%) | | | | | | | |
|---|---|---|---|---|---|---|---|---|
| Condition | Yellow Phosphor | Green Phosphor | Amber Phosphor (600 nm) | Amber Phosphor (580 nm) | Red Phosphor (610 nm) | Red Phosphor (630 nm) | CRI | Relative luminous flux (%) |
| 1 | 100% | — | — | — | — | — | 67 | 103% |
| 2 | — | 77.56% | 22.44% | — | — | — | 74 | 100% |
| 3 | — | 59.7% | — | 40.3% | — | — | 71 | 103% |
| 4 | — | 76.5% | — | 21.0% | — | 2.5% | 74 | 100% |
| 5 | — | 67.7% | — | 28.66% | 3.64% | — | 74 | 103% |

As a yellow phosphor for comparison, a YAG phosphor is used by way of example in Condition No. 1. As can be seen from Table 4, the YAG phosphor has a CRI of 67 and a relative luminous flux of 103%.

In addition, as can be seen from Condition No. 2, in the case in which both a green phosphor and an amber phosphor having a peak wavelength of 600 nm are used, a CRI increases to 74 and a relative luminous flux is reduced, as compared to those in Condition No. 1.

Meanwhile, as can be seen from Condition No. 3, in the case in which both a green phosphor and an amber phosphor having a peak wavelength of 580 nm are used, a CRI increases to 71 and a relative luminous flux increases to 103%, as compared to those in Condition No. 1.

As can be seen appreciated from Condition No. 4 as a comparative example, in the case in which a green phosphor, an amber phosphor having a peak wavelength of 580 nm and a red phosphor having a peak wavelength of 630 nm are used, a CRI increases to 74 and a relative luminous flux is reduced to 100%, as compared to those in Condition No. 1.

On the other hand, as can be seen from Condition No. 5, in the case in which a green phosphor, an amber phosphor having a peak wavelength of 580 nm and a red phosphor having a peak wavelength of 610 nm according to the present embodiment are used, a CRI increases to 74 and the relative luminous flux is not less than that of the YAG phosphor and, for example, is 103%. Here, the relative luminous flux of Condition No. 5 is described as 103%, which is identical to that of the YAG phosphor, and other values of Condition No. 5 are identical to those of Condition No. 3 in Table 3.

Figure 6:
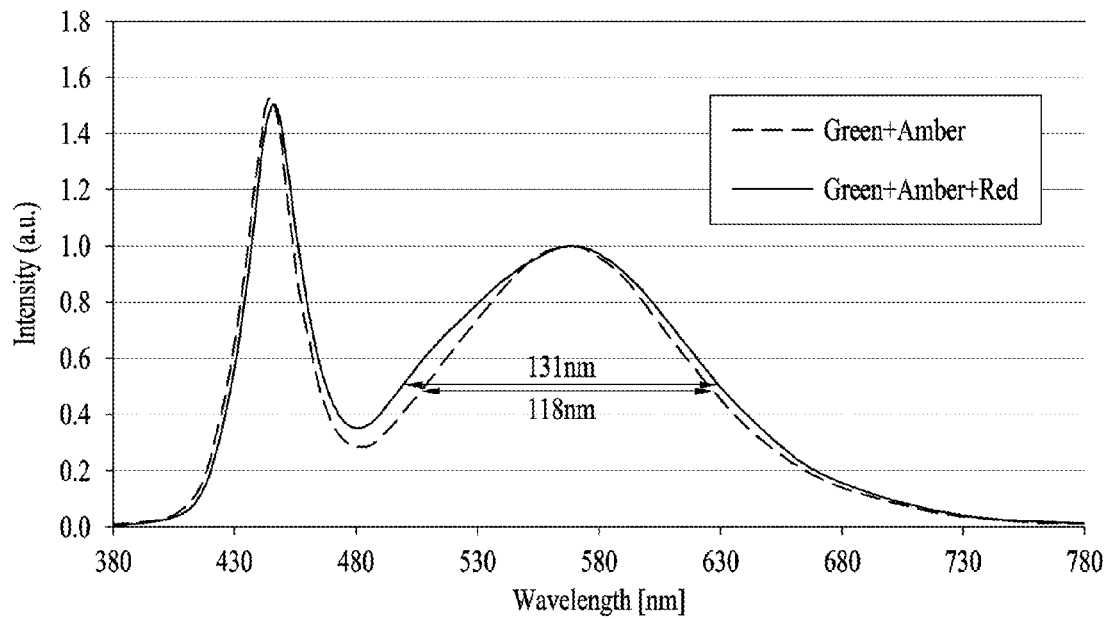
FIG. 6 is a graph showing an emission spectrum in the case of a white light emitting device package using a yellow light emitting phosphor according to the present invention.

FIG. 6 is a graph showing an emission spectrum in the case of a white light emitting device package using a yellow light emitting phosphor according to the present invention.

As exemplarily shown in FIG. 6, it can be appreciated that high quality white light may be emitted via combination of blue light having a wavelength of about 430 nm and yellow light emitted from a yellow light emitting phosphor according to the present invention as the yellow light emitting phosphor is excited by the blue light.

That is, the yellow light emitting phosphor (a mixture of a green phosphor, an amber phosphor, and a red phosphor) according to the present invention exhibits a superior optical characteristic to a comparative example (a mixture of a green phosphor and an amber phosphor).

As can be appreciated from the above description, the yellow phosphor of the present invention has no deterioration in light intensity and visibility as compared to the comparative example and is capable of emitting high quality white light in cooperation with near UV or a blue light emitting device.

In the case of the comparative example, as exemplarily shown in FIG. 2, the mixture of the green phosphor and the amber phosphor exhibits a superior characteristic to conventional yellow phosphors, such as YAG phosphors.

However, as can be seen from the drawings, a spectrum of light emitted from the yellow light emitting phosphor according to the present invention shows relatively uniform peak strength distribution in a visible light wavelength range (in a band of 380 to 780 nm) and achieves improved color rendering characteristic via change of the emission spectrum to a wider form.

In conclusion, the yellow light emitting phosphor may emit light of a wider spectrum located within a wavelength band of 480 to 780 nm by being excited by near UV or blue light and a full width at half maximum of the resulting spectrum has a value of 120 nm or more that is greater than 118 nm of the comparative example. More specifically, it can be appreciated that a full width at half maximum of the emission spectrum of the yellow light emitting phosphor according to the example of the present invention is 131 nm.

As described above, the present invention may provide a yellow light emitting phosphor having a good emission characteristic and the yellow light emitting phosphor may minimize deterioration in intensity (luminance) and improve a color rendering index (CRI).

In addition, the present invention may be applied to design of an illuminator having a high CRI of 80 or more and, consequently, may result in an improved color rendering characteristic close to that of sunlight.

In addition, the present invention may improve a color rendering index via design of a continuous spectrum and provide an optimum mixing ratio of phosphors to achieve the improved color rendering index. Thereby, provision of such an illuminator (e.g., a light emitting device package) having a wide spectrum allows a display to express color of a wide gamut.

<Light Emitting Device Package>

Figure 7:
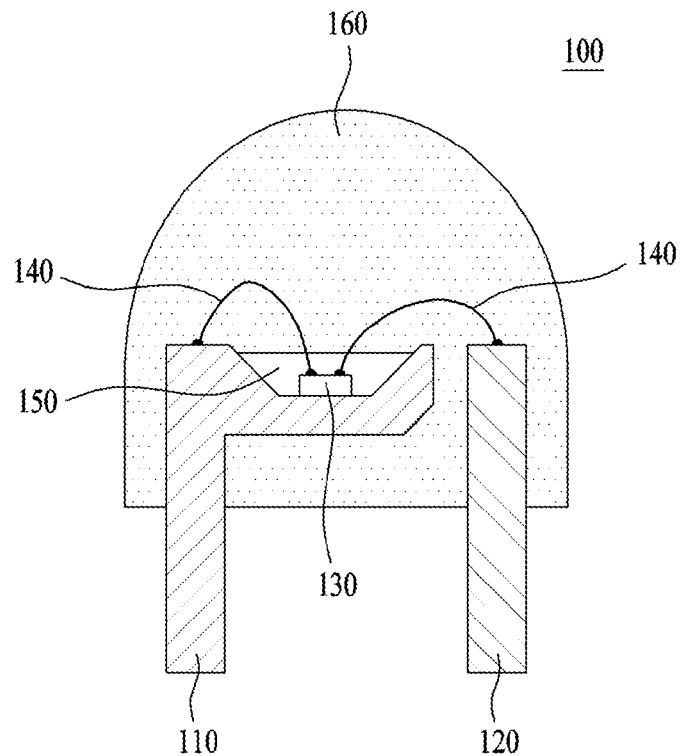
FIG. 7 is a sectional view showing one example of a light emitting device package using a yellow light emitting phosphor according to the present invention.

FIG. 7 is a sectional view showing one example of a light emitting device package using a yellow light emitting phosphor according to the present invention. Specifically, FIG. 7 shows an example of a lamp type light emitting device package 100 according to one embodiment of the present invention.

The lamp type white light emitting device package 100 includes a pair of lead frames 110 and 120 and a light emitting device 130 that generates light upon voltage application.

The light emitting device 130 is electrically connected to the lead frames 110 and 120 via wires 140 and a light transmissive resin 150 is molded over the light emitting device 130. The light emitting device 130 may emit near UV or blue light.

In addition, instead of the light emitting device to emit near UV, other light emitting devices that have a main emission peak wavelength within the same wavelength range, such as a laser diode, surface emission laser diode, inorganic electroluminescent device, organic electroluminescent device, and the like, may be used. In the present invention, use of a nitride semiconductor light emitting diode is described as a preferred application example. In FIG. 7, the light emitting device 130 is schematically shown, and any one of horizontal and vertical nitride semiconductor light emitting diodes may be used.

The light transmissive resin 150 may include phosphors 170, 171 and 172 (see FIG. 9) uniformly dispersed therein, and a shell material 160 may be provided on the light transmissive resin 150 to finish an exterior space of the entire device.

The used phosphors 170, 171 and 172 may respectively include the first phosphor (green phosphor) 170, the second phosphor (amber phosphor) 171, and the third phosphor (red phosphor) 172 as described above to emit yellow light by being excited by light emitted from the light emitting device 130. In some cases, other phosphor(s) may be added to the aforementioned phosphors. In some cases, two or more kinds of phosphors may be provided.

The light transmissive resin 150, which is used to form a molding member, may be selected from among light transmissive epoxy resin, silicon resin, polyimide resin, urea resin, acryl resin, and the like. Preferably, the light transmissive epoxy resin or the light transmissive silicon resin may be used.

While the light transmissive resin 150 of the present embodiment may be molded around the entire light emitting device 130, the light transmissive resin 150 may be partially molded only on a light emitting region as needed.

This is because, in the case in which a high-output light emitting device 130 having a large size is wholly molded, this may have a negative effect on uniform dispersion of the phosphors 170, 171 and 172 in the light transmissive resin 150. In this case, partially molding the light transmissive resin 150 only at a light emitting region may be advantageous.

Figure 8:
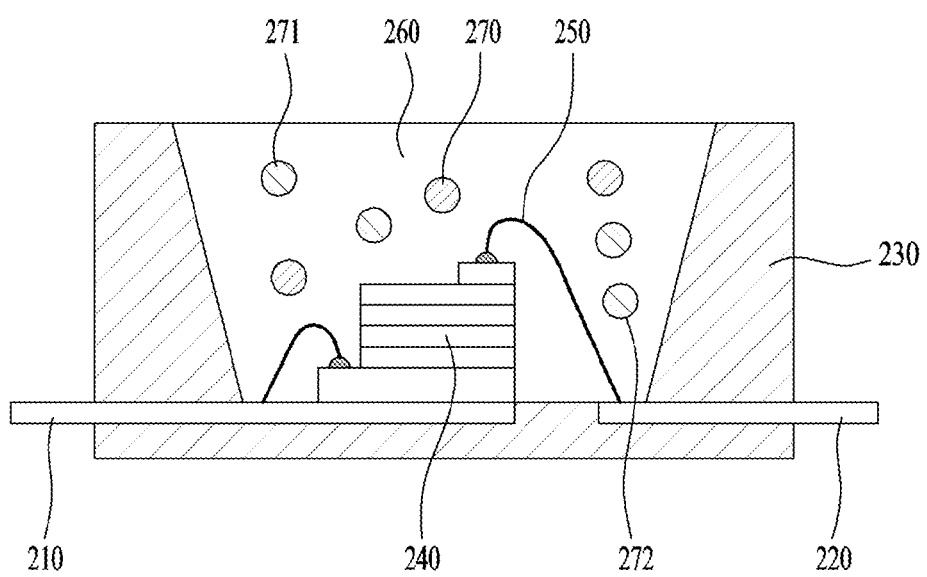
FIG. 8 is a sectional view showing another example of a light emitting device package using a yellow light emitting phosphor according to the present invention.

FIG. 8 is a sectional view showing another example of a light emitting device package using a yellow light emitting phosphor according to the present invention. FIG. 8 shows a surface-mount type light emitting device package 200.

The surface-mount type light emitting device package 200 according to one embodiment of the present invention, as exemplarily shown in FIG. 8, includes cathode and anode lead frames 210 and 220, and a light emitting device 240 disposed on any one of the cathode and anode lead frames 210 and 220 to generate light upon voltage application. The light emitting device 240 may be a light emitting diode or laser diode.

While FIG. 8 shows an example of the light emitting device 240 having a horizontal structure, of course, a light emitting device having a vertical structure may be used.

The light emitting device 240 is electrically connected to the lead frames 210 and 220 via wires 250, and a light transmissive resin 260 is molded over the light emitting device 240. The lead frames 210 and 220 may be secured to a package body 230, and the package body 230 may take the form of a reflector cup.

In addition, phosphors 270, 271 and 272 may be dispersed in the light transmissive resin 260.

The used phosphors 270, 271 and 272 may respectively include the first phosphor 270, the second phosphor 271, and the third phosphor 272 as described above, which are mixed with one another and dispersed in the light transmissive resin 260. Another phosphor may be added to the aforementioned phosphors. In some cases, the added phosphor may include two or more kinds of phosphors.

The light transmissive resin 260, which is used to form a molding member, may be selected from among light transmissive epoxy resin, silicon resin, polyimide resin, urea resin, acryl resin, and the like. Preferably, the light transmissive epoxy resin or the light transmissive silicon resin may be used.

While the light transmissive resin 260 may be molded around the entire light emitting device 240, the light transmissive resin 260 may be partially molded only on a light emitting region as needed.

A description of the other parts not described herein may be replaced with the above description of the same parts with reference to FIG. 7.

The light emitting device package 100; 200 according to the present invention as described above in detail may be a white light emitting device package.

Figure 9:
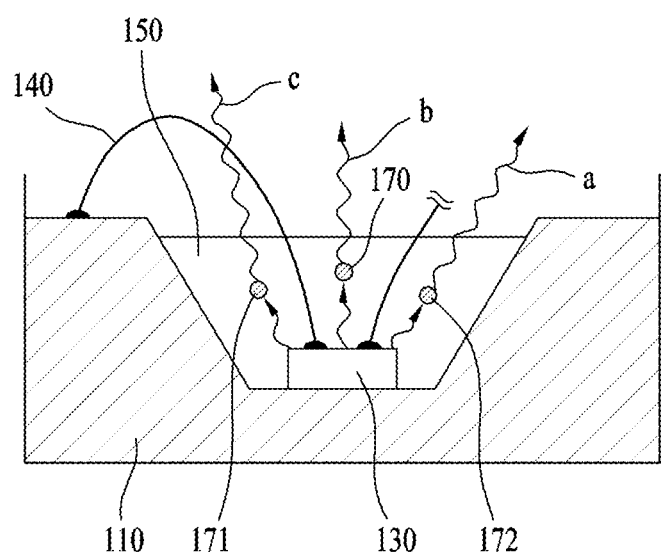
FIG. 9 is a partial enlarged view of FIG. 7 showing a process of producing white light using a yellow light emitting phosphor according to the present invention.

FIG. 9 is a partial enlarged view of FIG. 7 showing a process of creating white light. The following description may be equally applied to the case shown in FIG. 8.

Blue light within a wavelength range of 400 to 480 nm, which corresponds to near UV or blue light emitted from the light emitting device 130, passes through the phosphors 170, 171 and 172.

Some of the blue light is used to excite the phosphors 170, 171 and 172 to generate light having a central wavelength located within a range of 500 to 600 nm as exemplarily shown in FIG. 6 and the other blue light directly passes through the phosphors 170, 171 and 172.

At this time, light emitted from the light emitting device 130, as shown, excites the respective phosphors 170, 171 and 172 such that light a, light b and light c emitted respectively from the phosphors 170, 171 and 172 are combined with one another to enable emission of yellow light. As the yellow light is mixed with the blue light from the light emitting device 130, emission of white light may be accomplished.

As a result, white light having a spectrum of a wide wavelength within a range of 400 to 700 nm may be emitted. At this time, the red phosphor 172 causes formation of a wider spectrum, which enables creation of high quality light having an excellent color rendering characteristic.

Although the exemplary embodiments have been illustrated and described as above, of course, it will be apparent to those skilled in the art that the embodiments are provided to assist understanding of the present invention and the present invention is not limited to the above described particular embodiments, and various modifications and variations can be made in the present invention without departing from the spirit or scope of the present invention, and the modifications and variations should not be understood individually from the viewpoint or scope of the present invention.

What is claimed is:

1. A yellow light emitting phosphor comprising:
   a first phosphor including at least one of $BaYSi_4N_7$:Eu, $Ba_3Si_6O_{12}N_2$:Eu, $CaSi_2O_2N_2$:Eu, $SrYSi_4N_7$:Eu, α-type SiAlON(Ca-α-SiAlON:Yb) containing Ca as a metal component, $Lu_3Al_5O_{12}$:Ce, and $SrSi_2O_2N_2$:Eu, the first phosphor being adapted to emit light having a central wavelength located within a band of 510 nm to 550 nm;
   a second phosphor including at least one of α-type SiAlON (Li-α-SiAlON:Eu) containing Li as a metal component and α-type SiAlON(Ca-α-SiAlON:Eu) containing Ca as a metal component, the second phosphor being mixed with the first phosphor to emit light having a central wavelength located within a band of 560 nm to 600 nm; and
   a third phosphor including at least one of $CaAlSiN_3$:Eu, (Sr, Ca)$AlSiN_3$:Eu, $Sr_2Si_5N_8$:Eu, $K_2SiF_6$:Mn, $La_3Si_6N_{11}$:Ce, $SrAlSiN_3$:Eu, $SrCN_2$:Eu, $Ca_2Si_5N_8$:Eu, $Ba_2Si_5N_8$:Eu, $SrAlSi_4N_7$:Eu, and (Sr, Ba)$SiN_2$:Eu, the third phosphor being mixed with the first and second phosphors to emit light having a central wavelength located within a band of 610 nm to 630 nm, the third phosphor having a light absorption rate of 50% or less at a wavelength of 550 nm.

2. The yellow light emitting phosphor according to claim 1, wherein the second phosphor is α-type SiAlON(Li-α-SiAlON:Eu) containing Li as a metal component.

3. The yellow light emitting phosphor according to claim 1, wherein the second phosphor is represented by the following chemical formula 1:

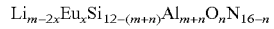

$$Li_{m-2x}Eu_xSi_{12-(m+n)}Al_{m+n}O_nN_{16-n}$$

where, "x", "m" and "n" fulfill at least one condition of $0.01 \le x \le 0.1$, $0 \le m \le 2$ and $0 \le n \le 1$.

4. The yellow light emitting phosphor according to claim 1, wherein the first phosphor is a phosphor represented by a chemical formula of $Lu_3Al_5O_{12}$:Ce.

5. The yellow light emitting phosphor according to claim 1, wherein the first phosphor is present in an amount of 62 wt % to 75.8 wt % when the sum of the first phosphor to the third phosphor is 100 wt %.

6. The yellow light emitting phosphor according to claim 1, wherein the second phosphor is present in an amount of 20 wt % to 35 wt % when the sum of the first phosphor to the third phosphor is 100 wt %.

7. The yellow light emitting phosphor according to claim 1, wherein the third phosphor is present in an amount of 3 wt % to 4.2 wt % when the sum of the first phosphor to the third phosphor is 100 wt %.

8. The yellow light emitting phosphor according to claim 1, wherein a ratio of the third phosphor to the second phosphor is within a range of 8.6% to 21.0%.

9. The yellow light emitting phosphor according to claim 1, wherein the third phosphor is a phosphor represented by (Sr, Ca)AlSiN$_3$:Eu.

10. The yellow light emitting phosphor according to claim 1, wherein an emission spectrum of the yellow light emitting phosphor within a wavelength band of 480 nm to 780 nm has a full width at half maximum of 120 nm or more.

11. A yellow light emitting phosphor comprising:
a first phosphor including at least one of BaYSi$_4$N$_7$:Eu, Ba$_3$Si$_6$O$_{12}$N$_2$:Eu, CaSi$_2$O$_2$N$_2$:Eu, SrYSi$_4$N$_7$:Eu, α-type SiAlON(Ca-α-SiAlON:Yb) containing Ca as a metal component, Lu$_3$Al$_5$O$_{12}$:Ce, and SrSi$_2$O$_2$N$_2$:Eu, the first phosphor being adapted to emit light having a central wavelength located within a band of 510 nm to 550 nm;
a second phosphor including at least one of α-type SiAlON (Li-α-SiAlON:Eu) containing Li as a metal component and α-type SiAlON(Ca-α-SiAlON:Eu) containing Ca as a metal component, the second phosphor being adapted to emit light having a central wavelength located within a band of 560 nm to 600 nm; and
a third phosphor including at least one of CaAlSiN$_3$:Eu, (Sr, Ca)AlSiN$_3$:Eu, Sr$_2$Si$_5$N$_8$:Eu, K$_2$SiF$_6$:Mn, La$_3$Si$_6$N$_{11}$:Ce, SrAlSiN$_3$:Eu, SrCN$_2$:Eu, Ca$_2$Si$_5$N$_8$:Eu, Ba$_2$Si$_5$N$_8$:Eu, SrAlSi$_4$N$_7$:Eu, and (Sr, Ba)SiN$_2$:Eu, the third phosphor being adapted to emit light having a central wavelength located within a band of 610 nm to 630 nm,
wherein a mixture of the first phosphor to the third phosphor is excited by near ultraviolet (UV) or blue excitation light to emit light of a spectrum having a central wavelength located within a band of 480 nm to 780 nm, and a full width at half maximum of the spectrum is 120 nm or more.

12. The yellow light emitting phosphor according to claim 11, wherein the third phosphor is designed to minimize absorption of light caused by the excitation light.

13. The yellow light emitting phosphor according to claim 11, wherein the third phosphor has a light absorption rate of 50% or less at a wavelength of 550 nm.

14. The yellow light emitting phosphor according to claim 11, wherein the first phosphor is present in an amount of 62 wt % to 75.8 wt % when the sum of the first phosphor to the third phosphor is 100 wt %.

15. The yellow light emitting phosphor according to claim 11, wherein the second phosphor is present in an amount of 20 wt % to 35 wt % when the sum of the first phosphor to the third phosphor is 100 wt %.

16. The yellow light emitting phosphor according to claim 11, wherein the third phosphor is present in an amount of 3 wt % to 4.2 wt % when the sum of the first phosphor to the third phosphor is 100 wt %.

17. A yellow light emitting phosphor comprising:
a first phosphor including a phosphor represented by a chemical formula of Lu$_3$Al$_5$O$_{12}$:Ce, the first phosphor being adapted to emit light having a central wavelength located within a band of 510 nm to 550 nm;
a second phosphor including α-type SiAlON(Li-α-SiAlON:Eu) containing Li as a metal component, the second phosphor being adapted to emit light having a central wavelength located within a band of 560 nm to 600 nm; and
a third phosphor including a phosphor represented by (Sr, Ca)AlSiN$_3$:Eu, the third phosphor being adapted to emit light having a central wavelength located within a band of 610 nm to 630 nm,
wherein weight proportions of the first phosphor, the second phosphor, and the third phosphor are respectively within a range of 62 wt % to 75.8 wt %, within a range of 20 wt % to 35 wt %, and within a range of 3 wt % to 4.2 wt % when the sum of the first phosphor to the third phosphor is 100 wt %.

18. The yellow light emitting phosphor according to claim 17, wherein the third phosphor has a light absorption rate of 50% or less at a wavelength of 550 nm.

19. The yellow light emitting phosphor according to claim 17, wherein the second phosphor is represented by the following chemical formula;

$$Li_{m-2x}Eu_xSi_{12-(m+n)}Al_{m+n}O_nN_{16-n}$$

where, "x", "m" and "n" fulfill at least one condition of 0.01≤x≤0.1, 0≤m≤2 and 0≤n≤1.

20. A light emitting device package comprising:
the yellow light emitting phosphor according to claim 17; and
a light emitting device configured to emit near ultraviolet (UV) or blue light to excite the yellow light emitting phosphor.

* * * * *